(12) United States Patent
Kurosaki

(10) Patent No.: US 6,314,536 B1
(45) Date of Patent: Nov. 6, 2001

(54) MEMORY TESTING APPARATUS

(75) Inventor: Hiroshi Kurosaki, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/314,652

(22) Filed: May 19, 1999

(30) Foreign Application Priority Data

May 19, 1998 (JP) ................................................ 10-136974

(51) Int. Cl.$^7$ .................................................. G11C 29/00
(52) U.S. Cl. ............................................................ 714/718
(58) Field of Search .................... 714/718, 719, 714/720

(56) References Cited

U.S. PATENT DOCUMENTS 6,115,833 * 9/2000 Sato et al. ............................. 714/718
6,243,841 * 6/2001 Mydill .................................. 714/724

* cited by examiner

Primary Examiner—Phung M. Chung
(74) Attorney, Agent, or Firm—David N. Lathrop, Esq.; Gallagher & Lathrop

(57) ABSTRACT

There is provided a memory testing apparatus capable of applying two address signals to a failure analysis memory in one test period, in the case that a memory under test operates in burst mode and adopts double data rate system. There is provided a burst address producing circuit 8 capable of producing two burst address signals in one test period, which comprises a clock-repetition-rate doubling circuit 15 for outputting a clock at twice the pulse repetition rate of the test period signal TI, a first multiplexer 16 for selecting either one of the clock TI and the rate-doubled clock from the circuit 15, and a burst address generating circuit for generating an address signal to be supplied to the failure analysis memory 5. The burst address generating circuit outputs two burst address signals in one test period by computing operation using an address signal first supplied from the pattern generator 2, in the case that a memory under test operates in burst mode and adopts double data rate system, and supplies them to the failure memory as burst address signals.

7 Claims, 5 Drawing Sheets

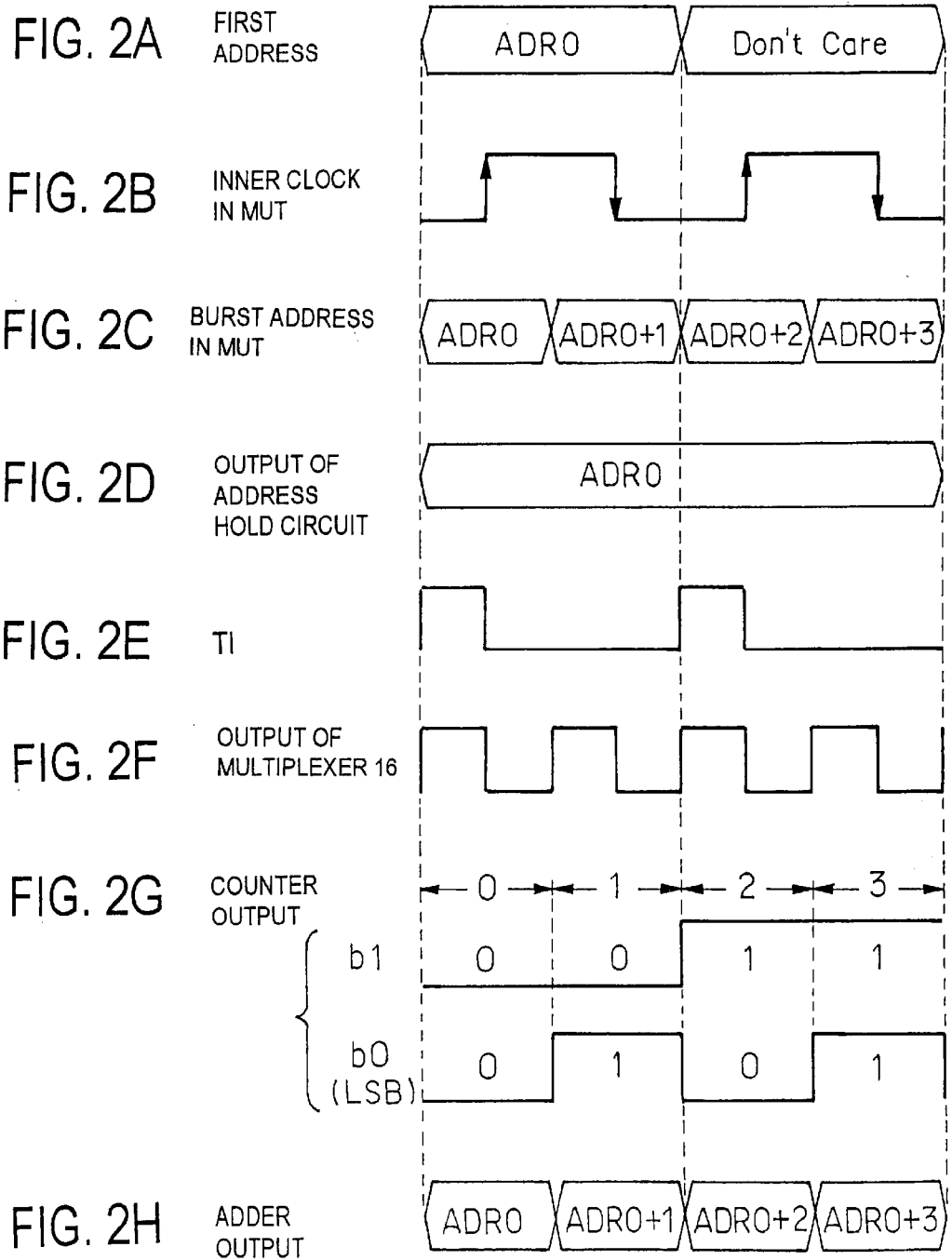

FIG. 3A  FIRST ADDRESS 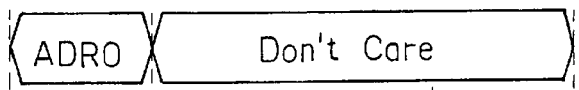
FIG. 3B  OUTPUT OF ADDRESS HOLD CIRCUIT 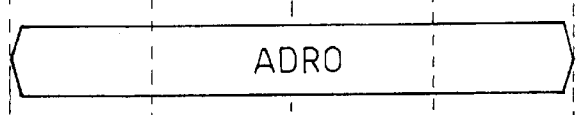
FIG. 3C  COUNTER OUTPUT 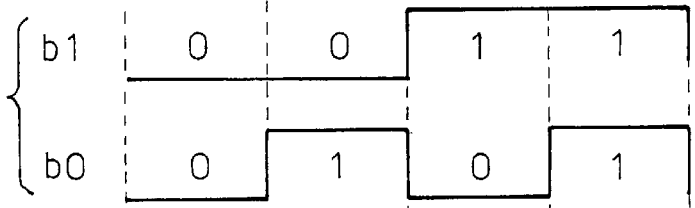
FIG. 3D  TI 
FIG. 3E  ADDER OUTPUT 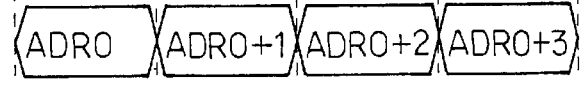

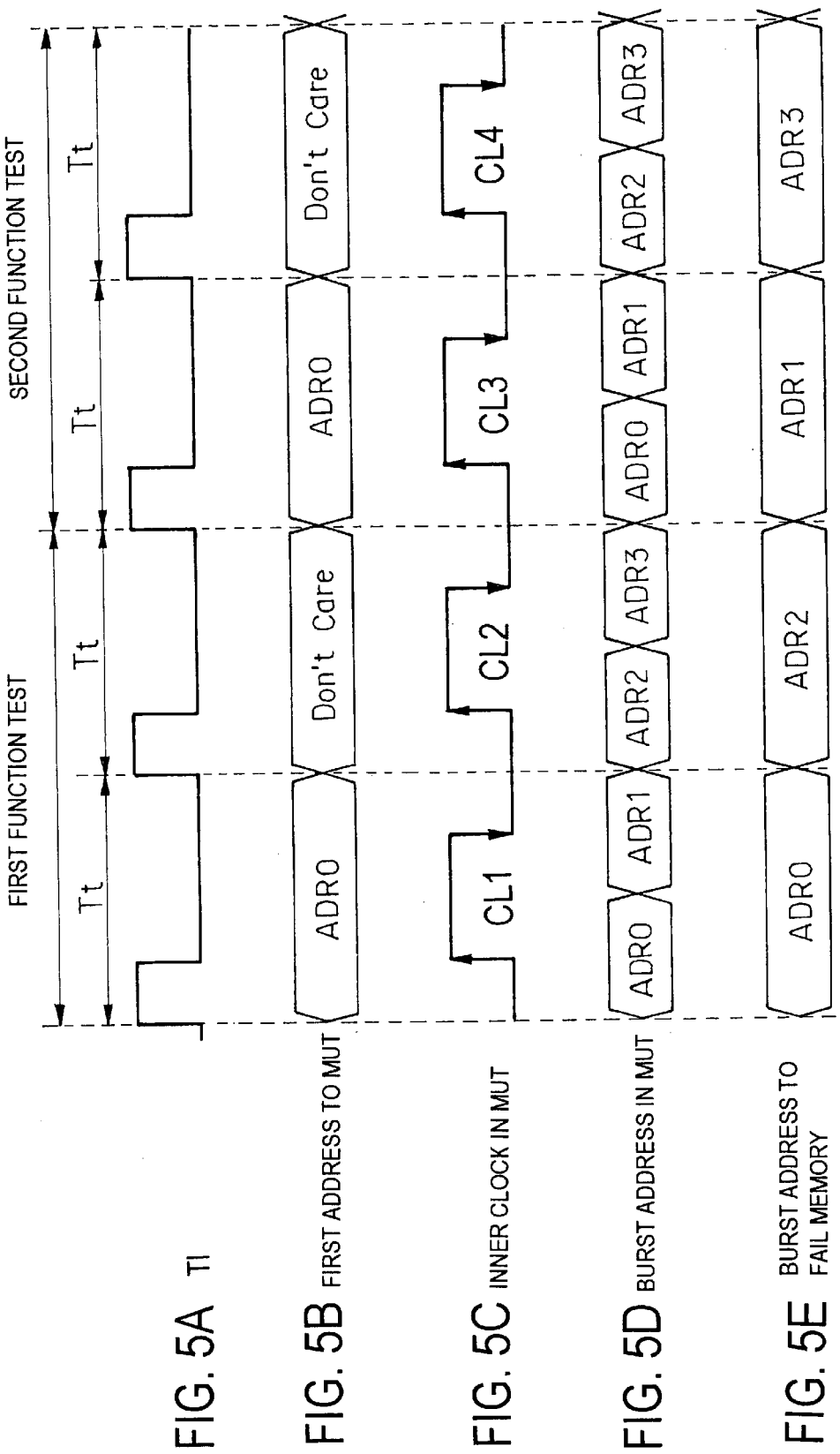

MEMORY TESTING APPARATUS

BACKGROUND OF THE INVENTION

1. Field of the Invention

The present invention relates to a memory testing apparatus for testing various types of semiconductor memories, and more particularly, to such memory testing apparatus suitable for testing a memory in the form of semiconductor integrated circuit (hereinafter, referred to as IC), which adopts double data rate system and operates in burst mode.

2. Description of the Related Art

In sequentially transferred data, a set of plural data treated as one unit by a specified rule among them is called "burst" in this technical field, and a memory storing therein such a set of plural data (burst) as one unit is called "memory operates in bust mode" or "burst operation type memory" in this technical field. Also, a memory arranged such that it outputs two data in one clock period or cycle is called "double data rate type memory" or "memory adopting double data rate system" in this technical field. In this specification, the above definitions are also incorporated therein.

A semiconductor integrated circuit memory (an IC memory) which adopts double data rate system and operates in burst mode internally generates two address signals in one clock period or cycle. For this reason, in the case that a memory testing apparatus tests an IC memory of such type and supplies failure cell information of the IC memory obtained from the test result to a failure analysis memory of the testing apparatus to store the information therein, like the internal operation of the IC memory, it is necessary that the memory testing apparatus apply two address signals to the failure analysis memory in one test period or cycle corresponding to one clock period in the IC memory.

FIG. 4 shows a general construction of the conventional memory testing apparatus for testing IC memories. As shown in the drawing, the memory testing apparatus 1 comprises a timing generator 7, a pattern generator 2, a logical comparator 4, a failure analysis memory (failure memory) 5, and a system controller 6. The timing generator 7 supplies a reference clock to the pattern generator 2 and the system controller 6 respectively. Further, the reference clock supplied to the system controller 6 is given as a test period signal TI for defining one test period or cycle in the memory testing apparatus 1.

The pattern generator 2 generates, in response to the reference clock supplied thereto from the timing generator 7, an address signal, a test signal of a predetermined pattern (a test pattern signal) S1 and a control signal which are to be supplied to an IC memory to be tested or under test 3 (commonly called MUT). Also, the pattern generator 2 generates an expected value signal of a predetermined pattern (an expected value pattern signal) S2 to be supplied to the logical comparator 4, an address signal AD to be supplied to the failure analysis memory 5, and the like. In addition, the address signal, the test pattern signal S1 and the control signal to be supplied to the IC memory under test 3 (hereinafter, referred to as memory under test or MUT) 3 are inputted to a waveform shaping device (not shown) where they are shaped to waveforms required to test the memory under test 3, and thereafter the shaped waveforms are applied to the memory under test 3.

The memory under test 3 is controlled in its writing operation in which a test pattern signals S1 is written thereinto or its reading operation in which the written data signal is read out thereof by a control signal applied to the memory under test 3 through the waveform shaping device, and under the control of this control signal, a test pattern signal S1 supplied from the waveform shaping device is written into the memory under test 3 or the written test pattern signal is read out thereof. The test pattern signals written into the memory under test 3 are read out later which are, in turn, supplied to the logical comparator 4 where the read out signals S3 are sequentially compared with expected value pattern signals S2 supplied from the pattern generator 2 one by one, thereby to detect whether there is an anti-coincidence or a discord between the read out signal S3 and the expected value pattern signal S2. By these comparison results, a decision is rendered that the memory under test 3 is a failure (defective or non-conforming) memory or a pass (conforming or good) memory.

When there is a discord between both signals, a failure signal FD of usually logic "1" (high level) indicating that this memory cell is not defective or good is outputted from the logical comparator 4 to the failure analysis memory 5 in which a failure data corresponding to this failure signal FD is stored at an address of the failure analysis memory 5 specified by an address signal AD supplied thereto from the pattern generator 2. In general, when the read out signal S3 coincides with the expected value pattern signal S2, the logical comparator 4 generates a pass signal of usually logic "0" (low level) indicating that this memory cell is defective or failure, but a data corresponding to this pass signal is not stored in the failure analysis memory 5.

Usually, the address signal supplied to the MUT 3 on reading the stored test pattern signal out of the MUT 3 is also supplied to the failure analysis memory 5, and hence the failure data is stored in the failure analysis memory 5 at the same address as that of the failure memory cell of the MUT 3.

In such a way, failure data each representing a position of a failure memory cell of the memory under test 3, which have occurred during a sequence of tests, are stored in the failure analysis memory 5. After completion of the tests, a failure analysis of the memory under test 3 is performed with reference to the failure data stored in the failure analysis memory 5. For example, in case such failure data are utilized for relieving the failure memory cells, a failure map is created based on the read out failure data to determine whether the detected failure positions (failure memory cells) can be relieved by relieving means previously provided on the memory under test 3.

Incidentally, in the case that the memory under test 3 operates in burst mode, an address signal which is added to the test pattern signal S1 and is applied to the memory under test 3 from the pattern generator 2 is only one burst leading address signal (also called the first address signal) which indicates an address of the leading or head data (the first data) in the burst, and burst address signals indicating addresses of the second and subsequent data in the burst are automatically produced internally of the memory under test 3 in synchronism with the rising edge and the falling edge of an internal clock in the memory under test 3. For example, if the burst leading address signal is fetched in at the rising edge of an internal clock in the memory 3, the subsequent burst address signals are automatically produced internally of the memory 3 in synchronism with the falling edge of that internal clock, the rising edge and the falling edge of a subsequent internal clock, . . . .

In order to give to or store in the failure analysis memory 5 the failure information at all of the addresses of the memory under test 3 which is operating in burst mode, it is required that the pattern generator 2 produces not only the first address signal but also the subsequent burst address signals automatically produced in the inside of the memory under test 3 and these burst address signals including the first address signal are supplied to the failure analysis memory 5.

The pattern generator 2 outputs the above-mentioned various kinds of signals in accordance with a pattern generating program previously stored in a memory of the system controller 6 when the program is supplied to the pattern generator 2 as a pattern generating instruction from the system controller 6. For this end, the pattern generating program previously stored in the memory of the system controller 6 is created such that the pattern generator 2 generates, in addition to address signals to be supplied to the memory under test 3, address signals to be supplied to the failure analysis memory 5 in accordance with this pattern generating program.

By way of example, it is assumed that the memory under test 3 operates in burst mode and adopts double data rate system, and that the burst length is over four addresses (the burst size is of four data), and the burst address signals produced internally of the memory under test 3 is in sequence of ADR0, ADR1, ADR2, ADR3 from the first to the last. A timing chart showing waveforms and address signals produced in main elements of the memory testing apparatus 1 in such case is illustrated in FIG. 5.

FIG. 5A shows a test period signal TI supplied to the system controller 6 from the timing generator 7, FIG. 5B shows the first address signal (the burst leading address signal) supplied to the memory under test 3 from the pattern generator 2, FIG. 5C shows an internal clock produced internally of the memory under test 3, and FIG. 5D shows the burst address signals produced internally of the memory under test 3.

When the memory under test 3 takes the burst leading address (the first address) signal ADR0 as shown in FIG. 5B therein at the rising edge of a first internal clock CL1 shown in FIG. 5C, it produces by itself the first address signal ADR0 as well as the subsequent burst address signals ADR1, ADR2, ADR3 as shown in FIG. 5D in synchronism with the falling edge of the first internal clock CL1, the rising edge and the falling edge of a second internal clock CL2 respectively. As is clear from FIG. 5D, the memory under test 3 produces two burst address signals in one internal clock period Tt such as ADR0 and ADR1 in the first internal clock period, and ADR2 and ADR3 in the second internal clock period. In this example, the rise timing and the fall timing of each internal clock locates at the center of each of the burst address signals ADR0–ADR3 produced internally of the memory under test 3. The burst address signals including the first address signal ADR0 supplied to the failure analysis memory 5 from the pattern generator 2 is shown in FIG. 5E.

As discussed above, one clock period in the memory under test 3 corresponds to one test period in the memory testing apparatus 1. For this reason, in the case of storing in the failure analysis memory 5 the failure cell information of the memory under test 3 adopting double data rate system, it is desired to apply two address signals to the failure analysis memory 5 in one test period.

However, as described above, the conventional memory testing apparatus 1 is constructed such that only one address signal can be generated in one test period Tt from the pattern generator 2, and hence the measurement or test for IC memories is divided into two parts as show in FIG. 5, and the measurement for IC memories is performed two times one part by one part. That is, in the first function test, the pattern generator 2 generates for each test period Tt only the burst address signals ADR0 and ADR2 as shown in FIG. 5E corresponding to the burst address signals ADR0 and ADR2 shown in FIG. 5D in the first half of each test period Tt among the burst address signals ADR0–ADR3 produced internally of the memory under test 3, thereby to supply the burst address signals ADR0 and ADR2 to the failure analysis memory 5. Thereafter, in the second function test, the pattern generator 2 generates for each test period Tt only the burst address signals ADR1 and ADR3 as shown in FIG. 5E corresponding to the burst address signals ADR1 and ADR3 shown in FIG. 5D in the latter or second half of each test period Tt among the burst address signals ADR0–ADR3 produced internally of the memory under test 3, thereby to supply the burst address signals ADR1 and ADR3 to the failure analysis memory 5. In such way, by two function tests, all of the failure cell information of the memory under test 3 are stored in the failure analysis memory 5.

As mentioned above, a memory under test which operates in burst mode and adopts double data rate system internally generates two addresses in one clock period. Therefore, in the case of storing the failure cell information of the memory under test in the failure analysis memory 5 of the memory testing apparatus 1, it is desired to apply two address signals to the failure analysis memory 5 in one test period as in the internal operation of the memory under test. However, the conventional memory testing apparatus 1 cannot generate two address signals in one test period.

Consequently, two pattern generating programs are separately prepared, one for executing generation of address signals in the first half of each test period and the other for executing generation of address signals in the latter half of each test period, and the function test for IC memories is divided into two parts, one part being performed by use of the one pattern generating program, and the other part being performed by use of the other pattern generating program. By such two function tests, all of the failure cell information of the memory under test are stored in the failure analysis memory 5.

Accordingly, there is a drawback that in the conventional memory testing apparatus the test time period becomes twice as many, resulting in reduction of the throughput. Moreover, such programming is complicated, which imposes heavy burden or load on programmers.

SUMMARY OF THE INVENTION

It is an object of the present invention to provide a memory testing apparatus which is capable of supplying two address signals to a failure analysis memory in one test period, and hence capable of carrying out the test of memories at one time or within a shorter time period even in testing memories each operating in burst mode and adopting double data rate system.

It is an another object of the present invention to provide a memory testing apparatus which does not impose heavy burden or load on programmers.

In order to accomplish the above objects, in one aspect of the present invention, there is provided a memory testing apparatus in which a test pattern signal is applied to a memory under test from a pattern generator, a response output from the memory under test is compared with an expected value pattern from the pattern generator in a logical comparator, every time the comparison result indicates a disaccord, a failure data is stored in a failure memory, said memory testing apparatus further comprising: a burst address producing circuit for outputting two address signals in one test period by computing operation using an address signal first supplied to the burst address producing circuit from the pattern generator, in the case that a memory under test operates in burst mode and adopts double data rate system, and supplying them to the failure memory as burst address signals, said two address signals generated in one test period being address signals in the first half and in the latter half of the one test period respectively and being different from each other.

In a preferred embodiment, the burst address producing circuit includes a first multiplexer for selecting the burst address signal outputted from the burst address producing circuit when a memory under test operates in burst mode, or selecting the address signal outputted from the pattern generator when a memory under test does not operate in burst mode to supply the selected address signal to the failure memory.

In addition, the burst address producing circuit comprises: an address hold circuit for holding the first address signal; a clock-rate doubling circuit for doubling the pulse repetition rate of a test period signal, thereby to generate a rate-doubled clock of twice the pulse repetition rate of the test period signal; a counter for counting the rate-doubled clock; and computing means for computing all of the burst address signals using the output of the counter and the first address signal outputted from the address hold circuit.

Further, the burst address producing circuit includes a second multiplexer for selecting the rate-doubled clock when a memory under test adopts double data rate system, or selecting the test period signal when a memory under test does not adopt double data rate system to supply the selected signal to the counter.

The counter is previously set therein the maximum count number (N-1) depending upon the burst length N, said counter counting a clock, thereby to output the count value varying in sequence of 0, 1, 2, . . . , (N-1), 0, 1, 2, . . . .

The computing means my be constructed by an adder.

BRIEF DESCRIPTION OF THE DRAWINGS

FIGS. 2(A–H) are timing charts for showing waveforms and address signals generated in the main elements of the memory testing apparatus shown in FIG. 1 in the case that a memory under test operates in burst mode and adopts double data rate system;

FIGS. 3(A–E) are timing charts for showing waveforms and address signals generated in the main elements of the memory testing apparatus shown in FIG. 1 in the case that a memory under test operates in burst mode and does not adopt double data rate system;

FIGS. 5(A–E) are timing charts for showing waveforms and address signals generated in the main elements of the conventional memory testing apparatus shown in FIG. 4 in the case that a memory under test operates in burst mode and adopts double data rate system.

DETAILED DESCRIPTION OF THE PREFERRED EMBODIMENT

Now, a preferred embodiment of the present invention will be described in detail with reference to FIGS. 1 to 3.

Figure 1:
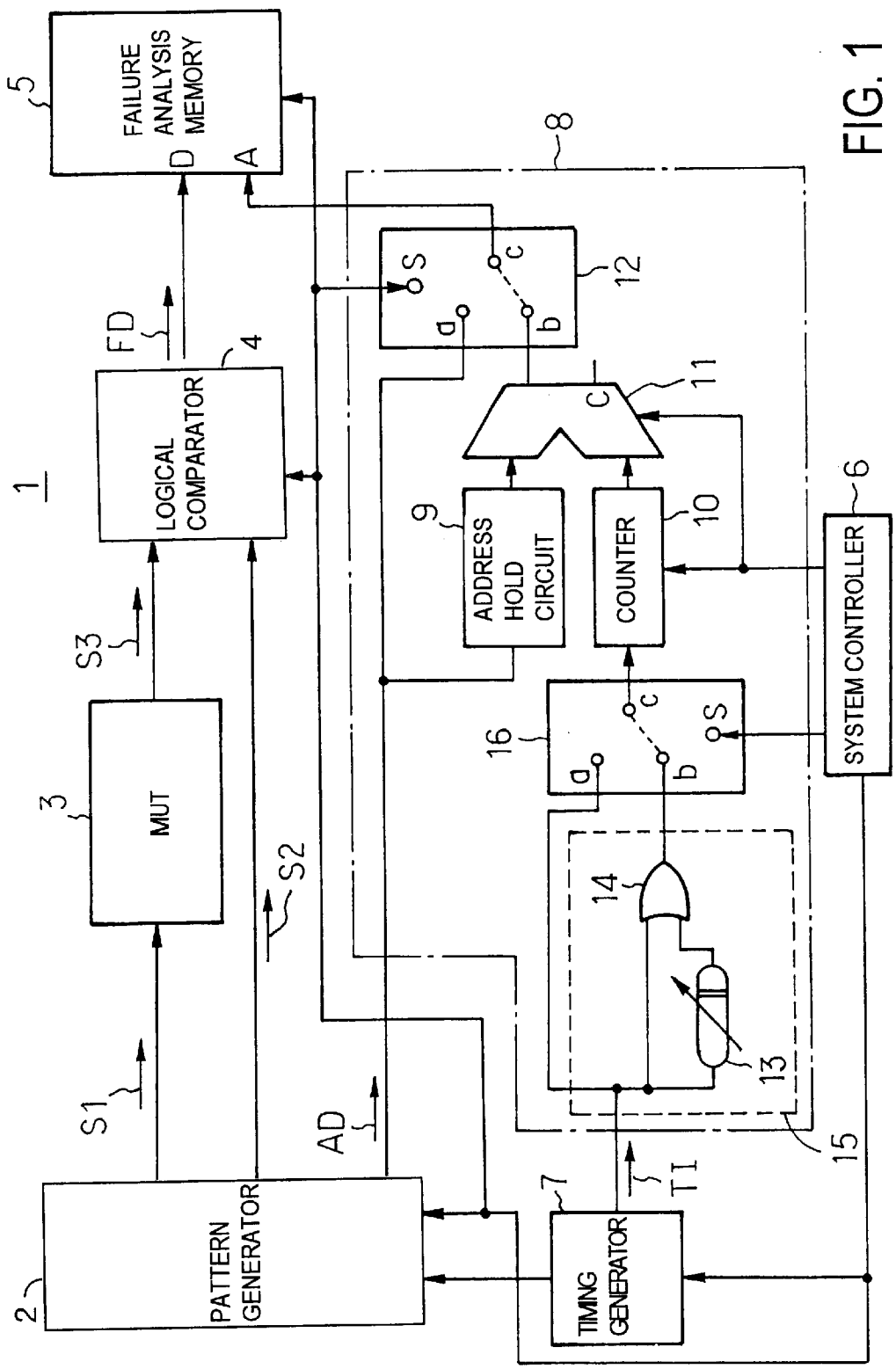
FIG. 1 is a block diagram showing an embodiment of the memory testing apparatus according to the present invention.

FIG. 1 shows in block diagram an embodiment of the memory testing apparatus according to the present invention. Portions and/or elements in FIG. 1 corresponding to those in FIG. 4 are shown by the same reference characters and numerals affixed thereto, and the explanation thereof will be omitted unless necessary.

Figure 4:
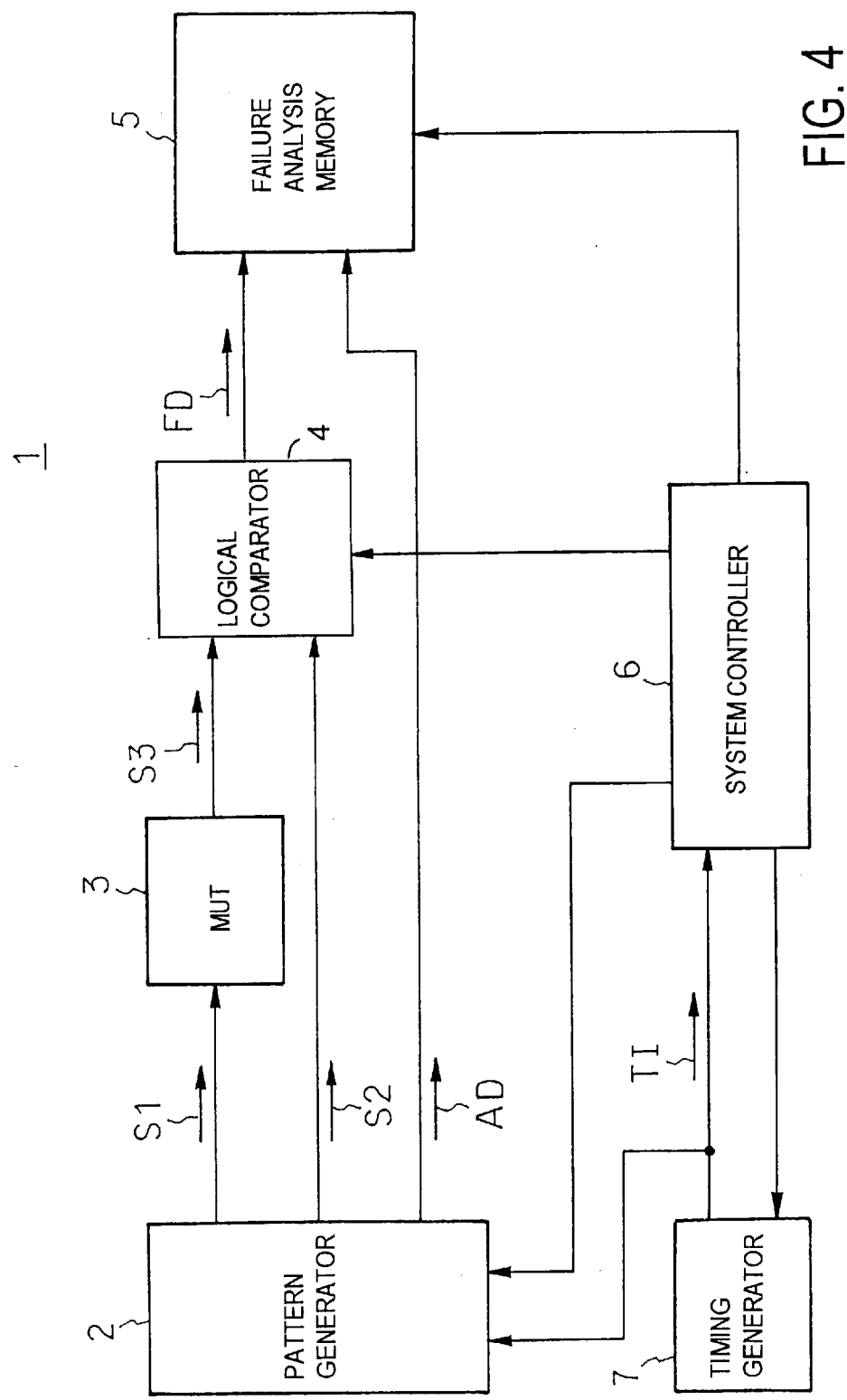
FIG. 4 is a block diagram showing a conventional memory testing apparatus.

Like the conventional memory testing apparatus shown in FIG. 4, the memory testing apparatus 1 shown in FIG. 1 comprises a timing generator 7, a pattern generator 2, a logical comparator 4, a failure analysis memory (failure memory) 5, and a system controller 6. The timing generator 7 supplies a reference clock to the pattern generator 2 and the system controller 6 respectively.

The pattern generator 2 generates, in response to the reference clock supplied thereto from the timing generator 7, an address signal, a test signal of a predetermined pattern (a test pattern signal) S1 and a control signal which are to be supplied to an IC memory to be tested or under test 3 (commonly called MUT). Also, the pattern generator 2 generates an expected value signal of a predetermined pattern (an expected value pattern signal) S2 to be supplied to the logical comparator 4, an address signal AD, and the like. In addition, the address signal, the test pattern signal S1 and the control signal to be supplied to the IC memory under test 3 (hereinafter, referred to as memory under test or MUT) 3 are inputted to a waveform shaping device (not shown) where they are shaped to waveforms required to test the memory under test 3, and thereafter the shaped waveforms are applied to the memory under test 3.

The test pattern signal written in the MUT 3 is sequentially read out therefrom and the read-out signal S3 is compared with an expected value pattern signal S2 supplied from the pattern generator 2 in the logical comparator 4. Every time the comparison result indicates a discord, a failure signal FD of usually logic "1" is outputted from the logical comparator 4 to supply it to a data terminal "D" of the failure analysis memory 5 in which a failure data corresponding to this failure signal FD is stored at an address of the failure analysis memory 5 specified by an address signal supplied to its address terminal "A". After the completion of the tests, the failure data stored in the failure analysis memory 5 are read out, and a failure analysis of the MUT 3 is performed.

In the present invention, the memory testing apparatus 1 further comprises a burst address producing circuit 8 capable of producing two burst address signals in one test period or cycle. Further, the reference clock is given to the burst address producing circuit 8 as a test period signal TI for defining one test period or cycle in the memory testing apparatus 1.

The burst address producing circuit 8 comprises a clock-repetition-rate doubling circuit 15 for outputting a clock at twice the pulse repetition rate of the clock or test period signal TI inputted thereto from the timing generator 7 (that is, outputting a clock at half of the period of the clock or test period signal TI inputted thereto), a first multiplexer 16 for selecting either one of the clock TI from the timing generator 7 and the rate-doubled clock from the clock-repetition-rate doubling circuit 15, and a burst address generating circuit for generating an address signal to be supplied to the failure analysis memory 5.

The clock-repetition-rate doubling circuit 15 for outputting a clock at twice the pulse repetition rate of the inputted clock (hereinafter, referred to as clock-rate doubling circuit) comprises a variable delay circuit 13 having its amount of delay time equal to half (½) of one test period and an OR circuit 14. The variable delay circuit 13 delays a clock or test period signal TI from the timing generator 7 by a time interval equal to half of one test period and supplies the delayed clock to one input of the OR circuit 14. The other input of the OR circuit 14 is supplied with a clock or test period signal TI directly from the timing generator 7. As a result, the OR circuit 14 outputs a clock at twice the clock repetition rate of the clock TI from the timing generator 7, that is, outputs a clock at half of the period of the clock TI.

The first multiplexer 16 selects either one of the test period signal TI directly supplied to one input terminal "a" thereof and the rate-doubled clock supplied to the other input terminal "b" thereof from the clock-rate doubling circuit 15, and outputs the selected clock at its output terminal "c". The input selecting operation of the multiplexer 16 is controlled by a select signal supplied to its select terminal "S" from the system controller 6.

The burst address generating circuit comprises an address hold circuit 9 for holding an address signal AD supplied thereto from the pattern generator 2, a counter 10 for counting the number of clocks supplied thereto from the first multiplexer 16, an adder 11 for summing up the output of the address hold circuit 9 and the output of the counter 10 to produce a burst address signal, and a second multiplexer 12 for selecting either one of the address signal AD supplied to one input terminal "a" thereof from the pattern generator 2 and the burst address signal supplied to the other input terminal "b" thereof from the adder 11. The second multiplexer 12 outputs the selected address signal at its output terminal "c", which is supplied to the address terminal "A" of the failure analysis memory 5. The input selecting operation of the second multiplexer 12 is controlled by a select signal supplied to its select terminal "S" from the system controller 6.

In the case that a memory under test 3 operates in burst mode and/or adopts double data rate system, the first multiplexer 16 and the second multiplexer 12 select their input terminals "b" by a select signal supplied from the system controller 6 respectively. In addition, if the count value of the counter 10 varies in sequence of 0, 1, 2, . . . , (N−1) (namely, 0→1→2 . . . →(N−1)), the system controller 6 previously sets the maximum count number (N−1) to the counter 10. Where N represents the burst length (the number of data or addresses in each of the bursts) and is an integer equal to or greater than 2.

If a memory under test 3 operates in burst mode and does not adopt double data rate system, only the second multiplexer 12 selects its input terminal "b" by a select signal supplied from the system controller 6, and the first multiplexer 12 remains in the state of selecting its input terminal "a". In this case, if the count value of the counter 10 varies in sequence of 0, 1, 2, . . . , (N−1) (namely, 0→1→2 . . . →(N−1)), the system controller 6 previously sets the maximum count number (N−1) to the counter 10.

By way of example, it is assumed that a memory under test 3 operates in burst mode and adopts double data rate system, and that the burst length is over four addresses (that is, N is four), and the burst address signals produced internally of the memory under test 3 is in sequence of ADR0, ADR0+1, ADR0+2, ADR0+3 from the first to the last. A timing chart showing waveforms and address signals produced in main elements of the memory testing apparatus 1 in such case is illustrated in FIG. 2.

Referring to FIG. 2, the timing generator 7 applies the reference clock to the pattern generator 2 and also applies the test period signal TI corresponding to the reference clock to the clock-rate doubling circuit 15 as shown in FIG. 2E. In response to the reference clock, the pattern generator 2 generates an address signal AD which is supplied to the address hold circuit 9 as the burst leading address signal (the first address signal) ADR0 as shown in FIG. 2A. The address hold circuit 9 holds the first address signal ADR0 as shown in FIG. 2D until a next address signal is supplied thereto. FIG. 2B shows a clock and FIG. 2C shows the burst address signals produced internally of the memory under test 3, respectively.

The rate-doubled clock pulse shown in FIG. 2F outputted from the clock-rate doubling circuit 15 is supplied via the first multiplexer 16 to the counter 10 which in turn counts the rate-doubled clock pulse supplied thereto. Since N is 4, and hence the maximum count number (N−1) is 3, the counter 10 outputs the count value varying in sequence of 0, 1, 2, 3, 0, 1, 2, 3, 0, 1, 2, 3, . . . , which can be represented by two bits ("0" and "1"), as shown in FIG. 2G.

The count value from the counter 10 is added to the first address signal ADR0 outputted from the address hold circuit 9 in the adder 11 (usually an arithmetic and logic unit) which in turn outputs the sum thereof varying in sequence of ADR0, ADR0+1, ADR0+2, ADR0+3, ADR0, . . . , and supplies it as the burst address signal to the address terminal "A" of the failure analysis memory 5 via the second multiplexer 12, as shown in FIG. 2H.

Thus, in the present invention, the memory testing apparatus 1 can generate two address signals in one test period Tt, and hence, even if a memory under test operates in burst mode and adopts double data rate system, two address signals can be applied to the failure analysis memory 5 in one test period as in the internal operation of the memory under test. Accordingly, all of the failure cell information of the memory under test is stored in the failure analysis memory 5 by one function test, resulting in the reduction of the test time period to half of that of the conventional memory testing apparatus.

In the case that a memory under test 3 operates in burst mode and does not adopt double data rate system, and that the burst length is over four addresses (that is, N is 4), and the burst address signals produced internally of the memory under test 3 is in sequence of ADR0, ADR0+1, ADR0+2, ADR0+3 from the first to the last, as mentioned above, only the second multiplexer 12 selects its input terminal "b" by a select signal supplied from the system controller 6, and the first multiplexer 12 selects its input terminal "a" by a select signal supplied from the system controller 6.

A timing chart showing waveforms and address signals produced in main elements of the memory testing apparatus 1 in such case is illustrated in FIG. 3.

In this case, the test period signal TI outputted from the timing generator 7 is supplied to the input terminal "a" of the counter 16 via the first multiplexer 16. The count value of the counter 10 varies in sequence of 0, 1, 2, 3, 0, 1, 2, 3, 0, 0 . . . , as shown in FIG. 3C. The count value from the counter 10 is added to the first address signal ADR0 outputted from the address hold circuit 9, as shown in FIG. 3B, in the adder 11 which in turn outputs the sum thereof varying in sequence of ADR0, ADR0+1, ADR0+2, ADR0+3, ADR0, . . . , and supplies it as the burst address signal to the address terminal "A" of the failure analysis memory 5 via the second multiplexer 12, as shown in FIG. 3E. FIG. 3A shows the first address signal and FIG. 3D shows the test period signal TI.

Thus, in the present invention, the memory testing apparatus 1 can store all of the failure cell information of the memory under test 3 in the failure analysis memory 5 by one function test, even if a memory under test operates adopts double data rate system, resulting in the reduction of the test time period to half of that of the conventional memory testing apparatus.

Further, in the case that a memory under test does not operate in burst mode, the second multiplexer 12 selects its input terminal "a" by a select signal supplied from the system controller 6, and hence an address signal AD outputted from the pattern generator 2 is directly supplied to the address terminal "A" of the failure analysis memory 5 as in the conventional memory testing apparatus.

As is apparent from the foregoing, in the present invention, to the memory testing apparatus is added the burst address producing circuit as constructed above, which is capable of outputting one address signal in one test period or two burst address signals in one test period. Therefore, even if a memory under test operates in burst mode and adopts double data rate system, two address signals can be applied to the failure analysis memory in one test period as in the internal operation of the memory under test. Accordingly, all of the failure cell information of the memory under test is stored in the failure analysis memory 5 by one function test, resulting in the reduction of the test time period to half of that of the conventional memory testing apparatus.

As to the pattern generating program given to the pattern generator, it suffices to give a program thereto, which is substantially the same as the conventional program given to the pattern generator of the conventional memory testing apparatus. That is, only a difference is that in the present invention an address signal is supplied to the burst address producing circuit as the first address signal from the pattern generator, whereas in the conventional memory testing apparatus an address signal is supplied to the failure analysis memory from the pattern generator. Such programming is very easy, which imposes hardly burden or load on programmers.

In addition, if it is arranged that after the first address signal supplied to the burst address producing circuit from the pattern generator is generated, arbitrary address signals may be generated, the present invention can be applied to various applications such that these arbitrary address signals can be used, for example, for pre-charging memory banks in a memory under test, or the like.

While the present invention has been described with regard to the preferred embodiment shown by way of example, it will be apparent to those skilled in the art that various modifications, changes, and/or improvements of the embodiment can be made without departing from the spirit and the scope of the present invention. Accordingly, it should be understood that the present invention is not limited to the embodiment shown and described above, and is intended to include such various inventions as defined by the appended claims.

What is claimed is:

1. A memory testing apparatus in which a test pattern signal is applied to a memory under test from a pattern generator, a response output from the memory under test is compared with an expected value pattern from the pattern generator in a logical comparator, every time the comparison result indicates a disaccord, a failure data is stored in a failure memory, said memory testing apparatus further comprising:
a burst address producing circuit for outputting two address signals in one test period by computing operation using an address signal first supplied to the burst address producing circuit from the pattern generator, in the case that a memory under test operates in burst mode and adopts double data rate system, and supplying them to the failure memory as burst address signals, said two address signals generated in one test period being address signals in the first half and in the latter half of the one test period respectively and being different from each other.

2. The memory testing apparatus according to claim 1, wherein said burst address producing circuit includes a first multiplexer for selecting the burst address signal outputted from the burst address producing circuit when a memory under test operates in burst mode, or selecting the address signal outputted from the pattern generator when a memory under test does not operate in burst mode to supply the selected address signal to the failure memory.

3. The memory testing apparatus according to claim 2, wherein said burst address producing circuit comprises: an address hold circuit for holding the first address signal; a clock-rate doubling circuit for doubling the pulse repetition rate of a test period signal, thereby to generate a rate-doubled clock of twice the pulse repetition rate of the test period signal; a counter for counting the rate-doubled clock; and computing means for computing all of the burst address signals using the output of the counter and the first address signal outputted from the address hold circuit.

4. The memory testing apparatus according to claim 3, wherein said burst address producing circuit includes a second multiplexer for selecting the rate-doubled clock when a memory under test adopts double data rate system, or selecting the test period signal when a memory under test does not adopt double data rate system to supply the selected signal to the counter.

5. The memory testing apparatus according to claim 3, wherein said counter is previously set therein the maximum count number (N−1) depending upon the burst length N, said counter counting a clock, thereby to output the count value varying in sequence of 0, 1, 2, . . . , (N−1), 0, 1, 2, . . . .

6. The memory testing apparatus according to claim 3, wherein said computing means is constructed by an adder.

7. The memory testing apparatus according to claim 1 wherein said burst address producing circuit comprises: an address hold circuit for holding the first address signal; a clock-rate doubling circuit for doubling the pulse repetition rate of a test period signal, thereby to generate a rate-doubled clock of twice the pulse repetition rate of the test period signal; a counter for counting the rate-doubled clock; and computing means for computing all of the burst address signals using the output of the counter and the first address signal outputted from the address hold circuit.

* * * * *